(12) United States Patent
Gill et al.

(10) Patent No.: US 8,316,281 B2
(45) Date of Patent: Nov. 20, 2012

(54) HIGH DENSITY TAPE DRIVE MULTI-CHANNEL LOW DENSITY PARITY CHECK CODING CONTROL

(75) Inventors: Richard A. Gill, Arvada, CO (US); Jin Lu, Lafayette, CO (US)

(73) Assignee: Oracle America, Inc., Redwood City, CA (US)

( * ) Notice: Subject to any disclaimer, the term of this patent is extended or adjusted under 35 U.S.C. 154(b) by 452 days.

(21) Appl. No.: 12/611,326

(22) Filed: Nov. 3, 2009

(65) Prior Publication Data

US 2011/0107187 A1    May 5, 2011

(51) Int. Cl.
*G06F 11/00* (2006.01)

(52) U.S. Cl. ........................................ 714/771

(58) Field of Classification Search .................. 714/771
See application file for complete search history.

(56) References Cited

U.S. PATENT DOCUMENTS

| | | | |
|---|---|---|---|
| 2009/0158125 A1* | 6/2009 | Harada et al. ................. | 714/764 |
| 2010/0180180 A1* | 7/2010 | Cideciyan et al. ............. | 714/771 |
| 2011/0283167 A1* | 11/2011 | Bliss et al. .................... | 714/776 |

* cited by examiner

*Primary Examiner* — Christopher McCarthy
(74) *Attorney, Agent, or Firm* — Brooks Kushman P.C.

(57) ABSTRACT

An LDPC coding system includes a number of LDPC encoders and a number of LDPC decoders. The number of encoders/decoders is between one and one fewer than the total number of tracks on the high density tape are provided. The LDPC encoders are operable to break data from an incoming data sector into the data blocks to be written to the high density tape. The LDPC decoders are operable to assemble the data blocks into data sectors.

16 Claims, 6 Drawing Sheets

HIGH DENSITY TAPE DRIVE MULTI-CHANNEL LOW DENSITY PARITY CHECK CODING CONTROL

TECHNICAL FIELD

The illustrative embodiments generally relate to high density tape drive multi-channel low density parity check (LDPC) coding control.

BACKGROUND AND SUMMARY OF ILLUSTRATIVE EMBODIMENTS

The recording density of magnetic tapes is ever increasing. With increased recording density, magnetic tapes have the capability to hold an ever increasing amount of information on the same length of tape. While original tapes may have had only a few tracks, modern tapes can have, for example, thirty-two tracks.

This increased capacity comes at a cost, however. Heavy system noise, residual interference and severe nonlinear distortions can become aggravated in read/write channels. Conventional error correction coding (ECC) may have difficulty handling these problems and system performance may be impaired.

One of the conventional problems with high density recording systems are dropouts. These dropouts are commonly seen in magnetic tape recording channels. They may cause significant signal amplitude loss and excessive amounts of peak shift. As the amplitude of the signal decreases significantly, it can be difficult to read/extract/write the data from/to the high density tape. Dropouts may be one of the major reasons for block errors at low SNR in high density tape recording.

Also major limiting factors include cycle slip and failure of timing recovery systems. These limiting factors can affect the performance of read/write channels as they can cause long bursts of bit errors. Cycle slip occurs when a clock gets out of synchronization with the data. This may cause part or all of the bits in a data sector to be in error until the end of the data sector. It prevents reasonable block error rate at high recording densities.

To ensure that high density magnetic recording systems continue to work reliably at significantly degraded signal to noise ratios (SNR), iterative soft coding techniques have been introduced.

At least one of these iterative soft coding techniques that shows promise in handling these problems is low density parity check (LDPC) coding. Simulation results and theoretic analysis demonstrate that the error correcting performance of LDPC codes is extremely close to the Shannon Capacity, the theoretical maximum error correction capability.

LDPC coding can be very beneficial to the high density magnetic tape recording products. But, incorporating LDPC encoder/decoder into each of the 32 tape read/write channels may be very expensive. In addition, dropouts, cycle slips and failures of timing recovery are big hurdles that may prevent reliable performances of tape products.

Encoder/decoder designs of LDPC codes can be very intricate and the hardware implementations of LDPC encoders/decoders may require a significant amount of hardware resources (gates, memory, etc.). This may be especially true when thirty-two or more copies of LDPC encoders/decoders are used for the thirty-two tracks of magnetic tape recording systems, such as in a system recording/decoding a thirty-two track tape.

In a first illustrative embodiment, an LDPC coding system includes a number of LDPC encoders. The total number of LDPC encoders is between one and one fewer than the total number of tracks on a high density tape to which data blocks are to be written (i.e., for a thirty-two track system, the total number of encoders would be between one and thirty-one).

Also, in this illustrative embodiment, a number of LDPC decoders between one and one fewer than the total number of tracks on the high density tape are provided.

This illustrative embodiment also includes a plurality of read/write heads corresponding to the number of tracks on the high density tape to which data blocks are to be written. For example, on a thirty-two track tape, there are thirty two read/write heads.

In this illustrative embodiment, the system also includes at least one multiplexer in operable communication with the LDPC encoders to transfer data blocks from each of the encoders to an appropriate read/write head, and at least one de-multiplexer in operable communication with the LDPC decoders to transfer data blocks from each of the appropriate read/write heads to an appropriate decoder.

According to this illustrative embodiment, the LDPC encoders are operable to break data from an incoming data sector into the data blocks to be written to the high density tape. In this embodiment each data block is of equal size to the other data blocks. The total number of data blocks each sector is broken into are equal to the total number of tracks divided by the number of encoders.

Finally, in this illustrative embodiment, the LDPC decoders are operable to assemble the data blocks into data sectors. A number of data blocks equal to the total number of tracks divided by the number of decoders is assembled into a single data sector.

In a second illustrative embodiment, an LDPC encoding apparatus includes one or more LDPC encoders. The total number of LDPC encoders is no more than one less than a total number of tracks on a high density tape to which data blocks are to be written.

In this embodiment, one or more multiplexers are in communication with the one or more LDPC encoders and are operable to transmit data from the one or more LDPC encoders to each of a plurality of read/write heads. Each of the read/write heads corresponds to a track on the high density tape to which data blocks are to be written.

In this embodiment, the LDPC encoders are operable to break a data sector into a number of blocks of equal length. The number of data blocks corresponds to the total number of tracks on the high density tape divided by the number of LDPC encoders. The LDPC encoders are further operable to provide each of the data blocks with one or more fundamental identifying pieces that identify the data block for reassembly.

In still a third illustrative embodiment, a method of writing to a high-density tape includes breaking incoming data sectors into data blocks of equal length using a fewer number of LDPC encoders than there are tracks on the high density tape. The method also includes providing each data block with identifying information that at least identifies a tape track to which the data block is to be written. Each data block is written to a different tape track in this embodiment.

The method includes routing each data block to the tape track to which the data block is to be written. Finally, the method includes writing each data block to the tape track to which the data block is to be written.

In a fourth illustrative embodiment, a method of reading from a high-density tape includes reading data blocks from individual tracks on a high density tape. In this method, each data block including identifying information that at least identifies a reassembly order for the data blocks.

The method further includes combining the data blocks into at least one data stream based at least in part on the identifying information.

In this embodiment, the method also includes feeding the at least one data stream into one or more LDPC decoders, the number of LDPC decoders being between one and one fewer than the total number of tracks on the high density tape.

Finally, the method includes recombining the data blocks into usable data sectors using the LDPC decoders.

DETAILED DESCRIPTION OF ILLUSTRATIVE EMBODIMENTS

Figure 1:
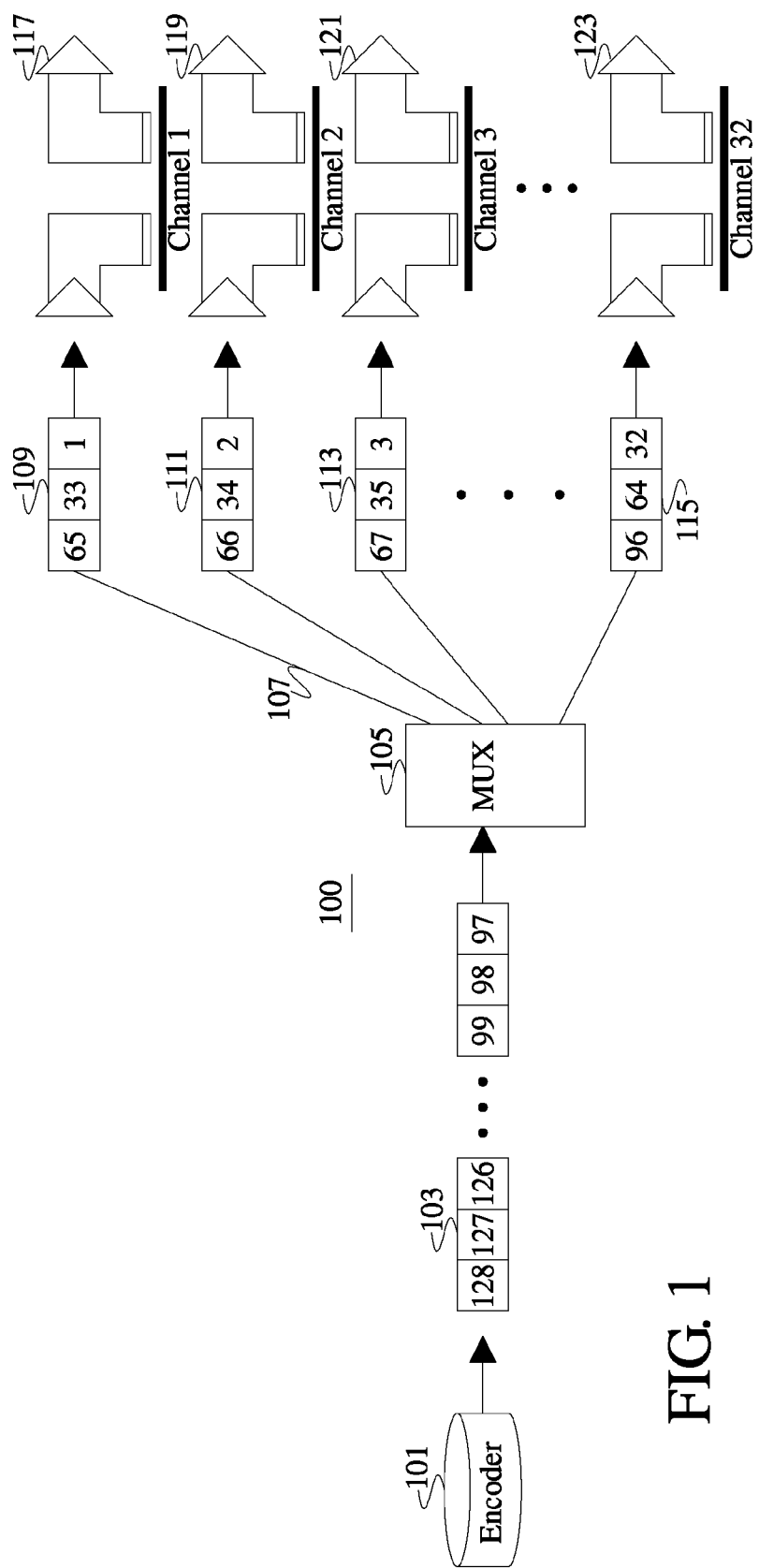
FIG. 1 shows an illustrative example of an LDPC encoding system.

In a first illustrative embodiment for writing to a high density tape drive, shown in FIG. 1, a single LDPC encoder is used to process a data stream. In this illustrative embodiment, the single encoder 101 breaks incoming data into thirty-two blocks of equal length 103. In the illustrative example shown, four data sectors have been broken into one hundred twenty eight blocks.

The data is then passed 107 from the encoder to each of the thirty two channels 117, 119, 121, 123 using, for example, a multiplexer 105. This allows the data to be written to each of the thirty two channels simultaneously.

In each of the thirty two channels, a data queue 109, 111, 113, 115 may be provided to aid in the through-put of the data, so that new blocks can be added to each queue as the LDPC encoder processes the data sectors.

As can be seen from this illustrative example, blocks 1, 33, 65, etc. are written to queue 109, blocks 2, 34, 66, etc. are written to queue 111, and so on for each of the thirty-two queues (or however many tracks the desired high density tape includes).

Figure 2:
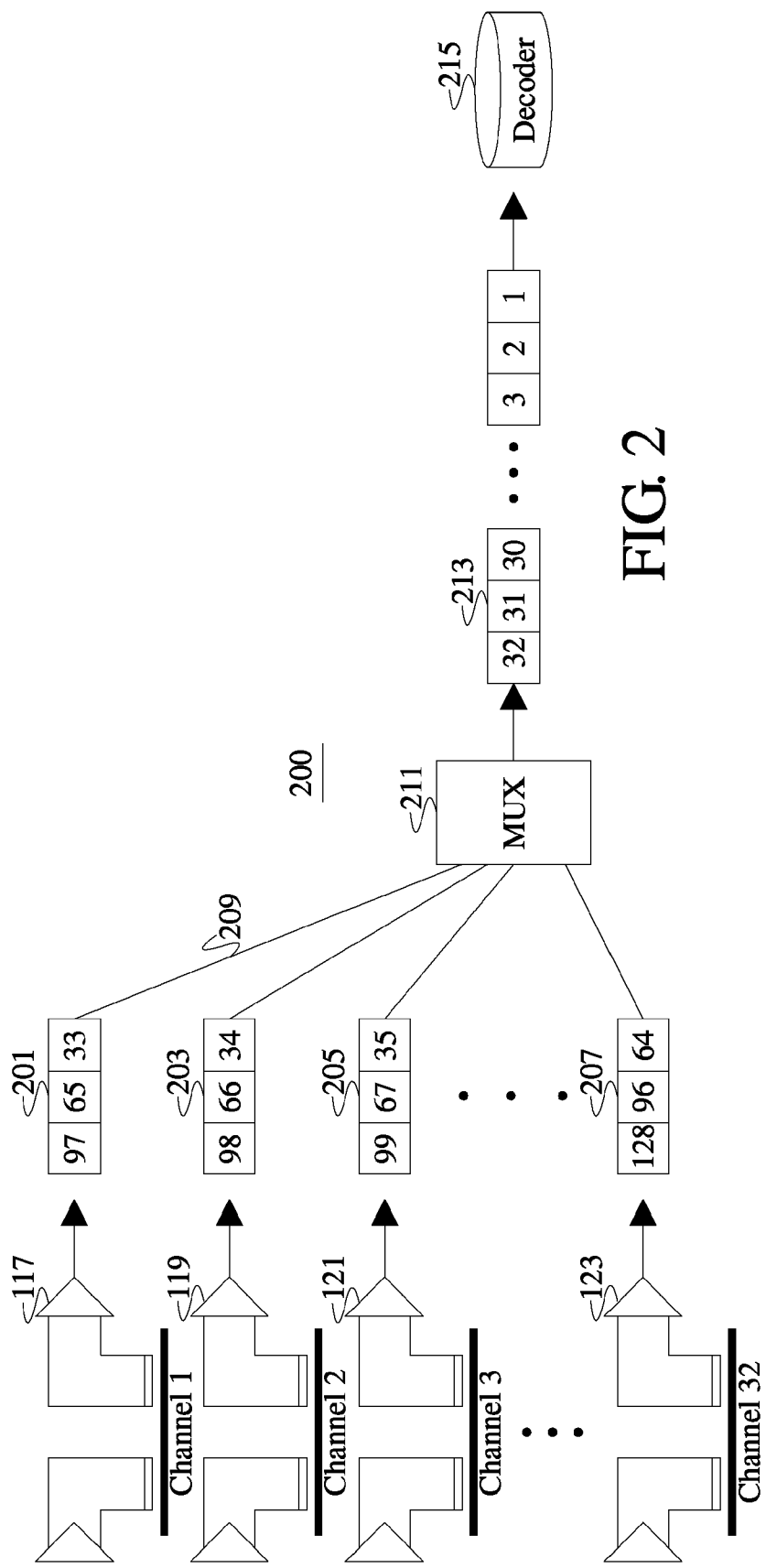
FIG. 2 shows an illustrative example of an LDPC decoding system.

An exemplary reading system is shown in the illustrative example shown in FIG. 2. As with the writing queues shown in FIG. 1, reading queues 201, 203, 205, 207 may be provided if needed to aid in through-put. For example, it may be desirable not to slow down a tape unless necessary. If an LDPC decoder is not able to process the data as quickly as it is read from the tape, it may be desirable to queue the data so that the tape can keep moving.

Data is pulled from each of the thirty-two tracks on the tape and is fed 209 to a Demultiplexer that will combine the thirty two individual blocks read from the tape into a single data stream 213.

This data stream is still thirty-two individual blocks representative of a single data sector. Accordingly, the data stream 213 is passed through an LDPC decoder to process the data back into the original data sector.

An encoding/decoding system such as this can effectively mitigate the negative impacts of dropouts, cycle slips, and failures of timing recovery systems. Since there are thirty-two channels (in this embodiment), only three percent of the data is transmitted over each particular channel. If dropouts or cycle slips occur in a given channel, this will at worst affect the three percent of the data transmitted over that channel.

If a powerful LDPC code (for example, without limitation, an LDPC code with code block length 4608 and 384 parity check constraints) is used, the three percent of the faulty data can be recovered based on the remaining ninety seven percent transmitted over the thirty one remaining channels. In an extreme example, the system can actually function if one of the thirty-two channels is actually dead from a physical error.

Figure 3:
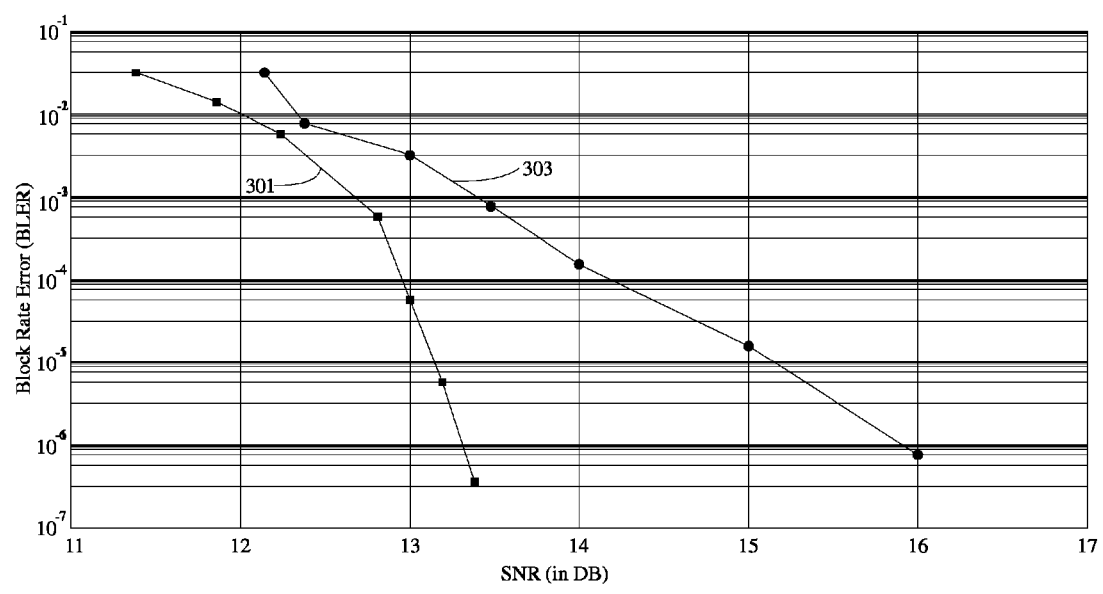
FIG. 3 shows an illustrative example of a comparison between a conventional LDPC coding system and an LDPC coding system according to at least one illustrative embodiment.

FIG. 3 shows an exemplary illustrative example of performance comparison between a conventional LDPC coding system 303 and a proposed illustrative embodiment 301.

In a conventional LDPC coding system shown in the line 303 on the graph of FIG. 3, the system works reliably at 16 dB. Contrastingly, the illustrative embodiment works similarly well at 13.4 dB, outperforming the conventional system by 2.6 dBs.

In this illustrative performance comparison, both LDPC coding control systems used the same LDPC code with code block length 4608 and 384 parity check constraints. One percent of the data sectors were corrupted by dropouts, and the dropout depth varied from thirty to sixty percent signal amplitude.

The illustrative LDPC coding control system is a flexible system wherein the number of encoders/decoders can be adjusted to meet the needs of a particular system. For example, in a thirty two track system, any number of decoders and/or encoders less than thirty two (for each of the encoders and/or decoders) can be used.

Figure 4:
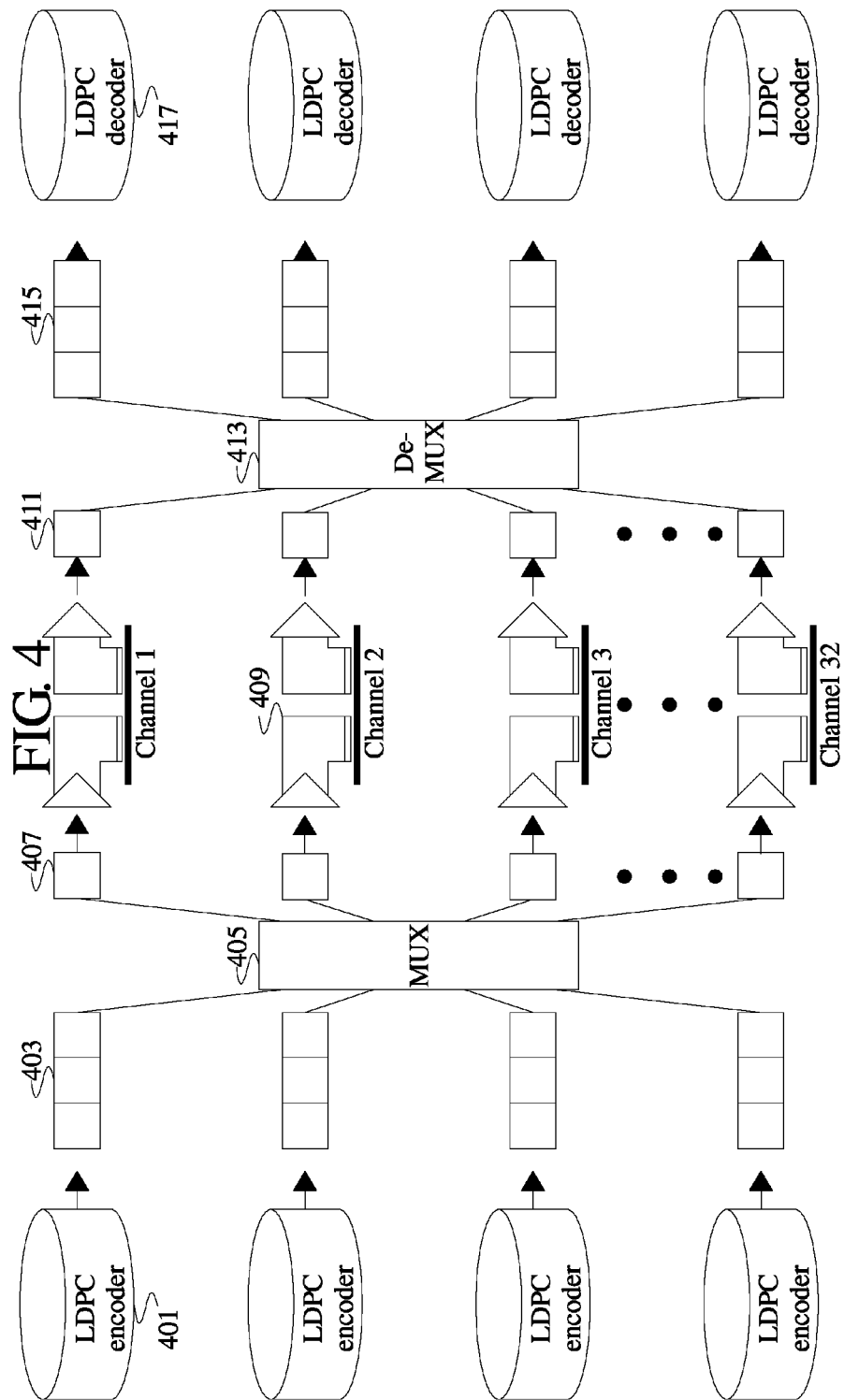
FIG. 4 shows an illustrative example of an LDPC coding system using four encoders and decoders.

FIG. 4 shows an illustrative example of a system using four LDPC encoders 401. This illustrative example also uses four LDPC decoders 417. Adding additional encoders/decoders may help increase throughput (although it increases hardware complexity too). Based on desired throughput levels, hardware complexity can be scaled to provide an optimal system for a given environment.

In the illustrative example shown in FIG. 4, each of four incoming data streams is processed by an individual LDPC encoder 401. Since there are four encoders and thirty two total channels, each encoder will be handling eight channels.

The multiplexer 405 routes the data from each of the encoders to the appropriate channels. In one embodiment, the first eight data blocks (from the first data sector processed by the first encoder) may be sent to channels one through eight (and so forth, for the data from the second through fourth encoders).

In another embodiment, the first eight data blocks may be sent to, for example, channels one, five, nine, etc. The data from the second encoder may be then sent to, for example, channels two, six, ten, etc.

The data, once sent to a tape, can then be read out over outgoing data queues 411. Each data block contains information about its own identity and can thus be reassembled by the decoders on the other end of the system 417.

The data is passed through a demultiplexer 413 and reassembled in order. The ordered data blocks are then passed through the appropriate number of LDPC decoders 417.

In the illustrative embodiments, a lower number of LDPC encoders and LDPC decoders may be used than are actual channels on the tape. For example, in a first illustrative embodiment, only one LDPC encoder and only one LDPC decoder may be used (the invention is not limited to this form, however, as will be seen later, multiple LDPC encoders and multiple LDPC decoders may be used).

In this illustrative embodiment, the single LDPC encoder and single LDPC decoder may be used for all thirty-two read/write channels.

In comparing a hardware complexity of the exemplary multi-channel LDPC coding control system defined by the illustrative embodiments and a conventional multi-channel LDPC coding system in which, for example, thirty-two LDPC coders are used, one per channel, it is seen that the proposed systems may be more cost effective to implement.

Generally speaking, in the first illustrative embodiment wherein only one LDPC encoder is used, only 1/32 of the hardware required for the conventional system is needed. Slightly better/faster hardware may be used to compensate for any loss of throughput present in the illustrative embodiments, but even if twice the hardware is used to obtain a superior LDPC encoder, only 1/16 of the hardware from a conventional system is required.

The illustrative embodiments, however, may be more cost effective to implement in hardware than a conventional system using, for example, 32 LDPC encoders/decoders for a 32 track tape. Accordingly, more powerful LDPC codes may be used. For example, instead of using LDPC codes with a block length of 4608 and 384 parity check constraints, an LDPC code with block length of 9612 and 768 parity check constraints may be used. This may provide more powerful error correcting performance.

Although the LDPC code with the longer block length and parity check constraints may require twice the hardware (in this case), the initial savings of using 1/32 the hardware may make this a cost effective decision. Even with a single LDPC encoder/decoder and the longer code blocks, only around 1/16 of the total hardware of a conventional system (using the shorter code blocks) may be required.

Figure 5:
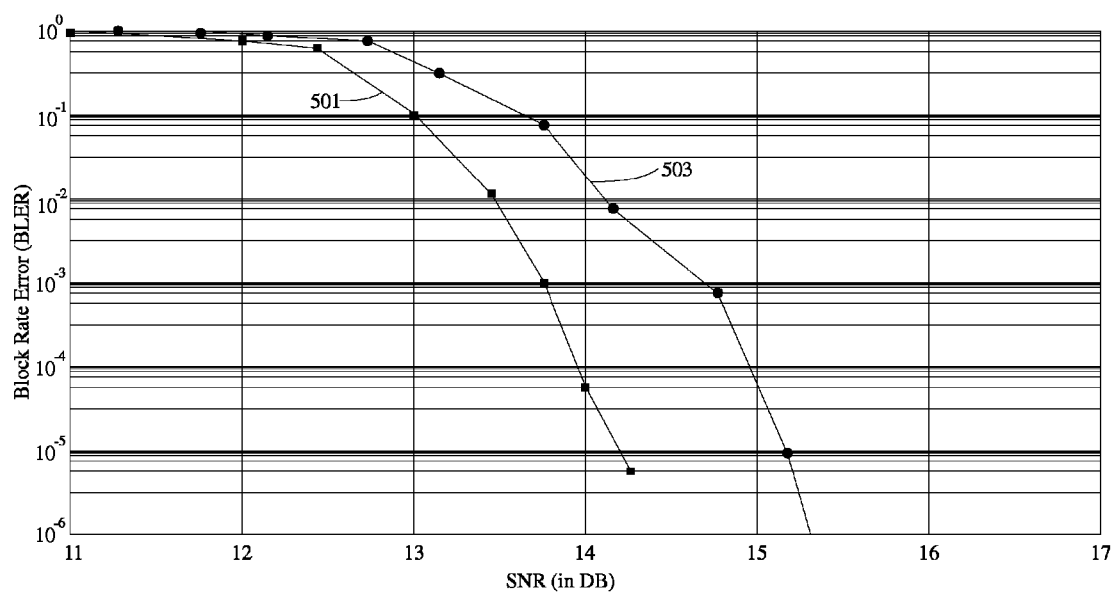
FIG. 5 shows an example of conventional and long LDPC code performance.

FIG. 5 shows an example of the conventional and long LDPC codes noted above. The line 501 shows an exemplary performance of the long code block LDPC and the line 503 shows an exemplary performance of the shorter code block LDPC.

Figure 6:
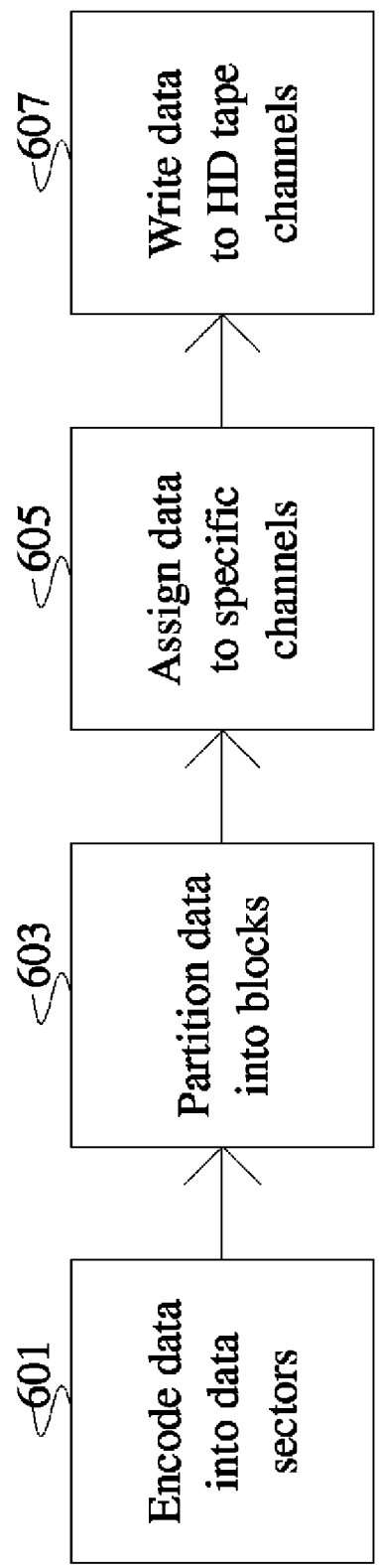
FIG. 6 shows an illustrative process for LDPC encoding.

FIG. 6 shows an illustrative process for LDPC encoding. First, user data to be written to a high density magnetic tape is encoded into sectors using the single global LDPC encoder 601. Next, the encoded data sectors are partitioned into thirty-two data sub-blocks of equivalent length 603.

After the partitioning, each of the thirty-two data blocks is assigned to a unique read/write channel 605. Different ones of the data sub-blocks are assigned to different read write channels. For example, without limitation, if there are thirty-two data sub-blocks and thirty-two channels, block one may be assigned to channel one, block two to channel two . . . block thirty three of the next thirty-two sub-block set derived from the next partitioned sector may be assigned back to channel one, etc.

All thirty-two of the sub-blocks of data may be transmitted in parallel on the thirty-two read/write channels simultaneously 607.

Each sub-block of data contains information about its identity. This allows a data stream received from all thirty-two read/write channels to be merged back into one data sector. This sector can then be processed through a single LDPC decoder to decode the merged data. The LDPC decoder can also be used to remove bit errors from the merged data. Based on the identity of the data streams from all thirty-two read write channels, the streams can be merged into sectors and processed.

The invention claimed is:

1. An LDPC coding system comprising:
a number of LDPC encoders between one and one fewer than a total number of tracks on a high density tape to which data blocks are to be written;
a number of LDPC decoders between one and one fewer than the total number of tracks on the high density tape;
a plurality of read/write heads corresponding to the number of tracks on the high density tape to which data blocks are to be written;
at least one multiplexer in operable communication with the LDPC encoders to transfer data blocks from each of the encoders to an appropriate read/write head;
at least one de-multiplexer in operable communication with the LDPC decoders to transfer data blocks from each of the appropriate read/write heads to an appropriate decoder; wherein
the LDPC encoders are operable to break data from an incoming data sector into the data blocks to be written to the high density tape, wherein each data block is of equal size to the other data blocks, and wherein the total number of data blocks a sector is broken into are equal to the total number of tracks divided by the number of encoders; and
wherein the LDPC decoders are operable to assemble the data blocks into data sectors, wherein a number of data blocks equal to the total number of tracks divided by the number of decoders is assembled into a single data sector.

2. The system of claim 1, wherein the LDPC encoder is a single LDPC encoder, and the LDPC decoder is a single LDPC decoder.

3. The system of claim 1, wherein the number of high density tape tracks is thirty two and the number of LDPC encoders is one of either two, four, eight or sixteen and the number of LDPC decoders is one of either two, four, eight or sixteen and corresponds to the total number of LDPC encoders.

4. The system of claim 1, wherein the number of read/write heads is thirty-two.

5. The system of claim 1, wherein the LDPC encoder uses block length of 4608 and 384 parity check constraints.

6. The system of claim 1, wherein the LDPC decoder uses block length of 4608 and 384 parity check constraints.

7. The system of claim 1, wherein the LDPC decoder is operable to reconstruct bad or corrupted data from at least one track based on uncorrupted data from other tape tracks.

8. An LDPC encoding apparatus comprising:
one or more LDPC encoders, wherein the total number of LDPC encoders is no more than one less than a total number of tracks on a high density tape to which data blocks are to be written;
one or more multiplexers in communication with the one or more LDPC encoders and operable to transmit data from the one or more LDPC encoders to each of a plurality of read/write heads corresponding to tracks on the high density tape to which data blocks are to be written;
wherein the LDPC encoders are operable to break a data sector into a number of blocks of equal length, the number of blocks corresponding to the total number of tracks on the high density tape divided by the number of LDPC encoders, and wherein the LDPC encoders are further operable to provide each of the data blocks with one or more identifying pieces that identify the data block for reassembly.

9. The apparatus of claim 8, wherein the number of LDPC encoders is one.

10. The apparatus of claim 8, wherein the total number of tracks on the high density tape is thirty-two.

11. The apparatus of claim 10, wherein the number of LDPC encoders is either two, four, eight or sixteen.

12. The system of claim 8, wherein the LDPC encoder uses block length of 4608 and 384 parity check constraints.

13. A method of reading from a high-density tape comprising:

reading data blocks from individual tracks on a high density tape, each data block including identifying information that at least identifies a reassembly order for the data blocks;

combining the data blocks into at least one data stream based at least in part on the identifying information;

feeding the at least one data stream into one or more LDPC decoders, the number of LDPC decoders being between one and one fewer than the total number of tracks on the high density tape; and recombining the data blocks into usable data sectors using the LDPC decoders.

14. The method of claim 13, wherein the number of LDPC decoders used is one.

15. The method of claim 13, wherein the number of tracks on the high density tape is thirty-two.

16. The method of claim 13, further including reconstructing bad data from one data block based on uncorrupted data from the remaining data blocks.

\* \* \* \* \*